US008598552B1

(12) United States Patent
Frihauf et al.

(10) Patent No.: US 8,598,552 B1
(45) Date of Patent: Dec. 3, 2013

(54) SYSTEM AND METHOD TO OPTIMIZE EXTREME ULTRAVIOLET LIGHT GENERATION

(75) Inventors: Paul Frihauf, La Jolla, CA (US); Daniel J. Riggs, San Diego, CA (US); Matthew R. Graham, San Diego, CA (US); Steven Chang, San Diego, CA (US); Wayne J. Dunstan, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 28 days.

(21) Appl. No.: 13/549,261

(22) Filed: Jul. 13, 2012

Related U.S. Application Data

(60) Provisional application No. 61/653,979, filed on May 31, 2012.

(51) Int. Cl.
  *H05G 2/00* (2006.01)
  *H01L 21/027* (2006.01)
  *G03F 7/20* (2006.01)

(52) U.S. Cl.
  USPC ............................. 250/504 R; 355/71; 355/75

(58) Field of Classification Search
  USPC ................................... 250/504 R; 355/71, 75
  See application file for complete search history.

(56) References Cited

U.S. PATENT DOCUMENTS

| | | | | |
|---|---|---|---|---|
| 6,806,756 B1 * | 10/2004 | Manlove et al. | ............... | 327/307 |
| 7,164,375 B2 * | 1/2007 | Sawada | ........................ | 341/143 |
| 7,507,960 B2 * | 3/2009 | Zani et al. | ..................... | 250/306 |
| 7,659,526 B2 * | 2/2010 | Zani et al. | ................ | 250/492.21 |
| 7,894,561 B1 * | 2/2011 | Buchanan | ...................... | 375/355 |
| 8,173,985 B2 * | 5/2012 | Bergstedt et al. | ......... | 250/504 R |
| 8,278,027 B2 * | 10/2012 | Scott et al. | ..................... | 430/296 |
| 2010/0258750 A1 * | 10/2010 | Partlo et al. | ............... | 250/504 R |
| 2012/0019826 A1 * | 1/2012 | Graham et al. | ............... | 356/400 |
| 2013/0234051 A1 * | 9/2013 | Rajyaguru et al. | ......... | 250/504 R |

OTHER PUBLICATIONS

Unknown, "Extreme Ultraviolet Lithography", in Wikipedia (accessed May 25, 2012 Nov. 30, 2010 at http://en.wikidepia.org/wiki/Extreme_ultraviolet_lithography), pp. 1-24.
Unknown, "Low-Pass Filter", in Wikipedia (archived Feb. 10, 2010 at http://web.archive.org/web/20100210074609/http://en.wikipedia.org/wiki/Low-pass_filter), pp. 1-15.
Unknown, "Mathematical Optimization", in Wikipedia (archived Jun. 8, 2011 at http://web.archive.org/web/20110608002740/http://en.wikipedia.org/wiki/Mathematical_optimization), pp. 1-24.
Unknown, "EUV: World's First integrated LPP EUV Source", at Cymer.com (accessed Mar. 13, 2012 at http;//staging.cymer.com/euvl/), pp. 1-2.
Unknown, "EUV Source: Leader in EUV Lithography Light Sources" at Cymer.com (accessed Mar. 13, 2012 at http://staging.cymer.com/euv_source/), pp. 1-3.

(Continued)

*Primary Examiner* — David A Vanore
(74) *Attorney, Agent, or Firm* — Gard & Kaslow LLP

(57) ABSTRACT

Energy output from a laser-produced plasma (LPP) extreme ultraviolet light (EUV) system varies based on how well the laser beam can maintain focus on a target material to generate the plasma that gives off light. The system and method described herein optimize EUV light generation by using a closed-loop gradient process to track and fine-tune in real-time the positioning of optical elements that determine how the laser beam is focused on the target material. When real-time alignment of the drive laser on droplet position is achieved, EUV generation is optimized.

20 Claims, 9 Drawing Sheets

(56) References Cited

OTHER PUBLICATIONS

Unknown, "Plasma Chamber Detail", at Cymer.com (accessed Mar. 3, 2012 at http://starging.cymer.com/plasma_chamber_detail/), pp. 1-3.

Unknown, "Why LPP?" at Cymer.com (accessed Mar. 13, 2012 at http://staging.cymer.com/lpp_technology/), pp. 1-3.

Unknown, "EUV Light Sources", at Cymer.com (accessed Mar. 13, 2012 at http://staging.cymer.com/euv_light_sources/), pp. 1-2.

* cited by examiner

SYSTEM AND METHOD TO OPTIMIZE EXTREME ULTRAVIOLET LIGHT GENERATION

CROSS-REFERENCE TO RELATED APPLICATIONS

This application claims priority to U.S. Provisional Patent Application No. 61/653,979, entitled "System and Method to Optimize Extreme Ultraviolet Light Generation" and filed May 31, 2012, the disclosure of which is incorporated herein by reference.

BACKGROUND OF THE INVENTION

1. Field of the Invention

The present invention relates generally to optimization of extreme ultraviolet (EUV) light generation, particularly closed-loop adjustment of optical element setpoints to optimize alignment of a laser beam onto a target droplet.

2. Description of the Prior Art

The semiconductor industry continues to develop lithographic technologies which are able to print ever-smaller integrated circuit dimensions. Extreme ultraviolet ("EUV") light (also sometimes referred to as soft x-rays) is generally defined to be electromagnetic radiation having wavelengths of between 10 and 110 nm. EUV lithography is generally considered to include EUV light at wavelengths in the range of 10-14 nm, and is used to produce extremely small features (e.g., sub-32 nm features) in substrates such as silicon wafers. These systems must be highly reliable and provide cost-effective throughput and reasonable process latitude.

Methods to generate EUV light include, but are not necessarily limited to, converting a material into a plasma state that has one or more elements (e.g., xenon, lithium, tin, indium, antimony, tellurium, aluminum, etc.) with one or more emission line(s) in the EUV range. In one such method, often termed laser-produced plasma ("LPP"), the required plasma can be generated by irradiating a target material, such as a droplet, stream or cluster of material having the desired line-emitting element, with a laser beam at an irradiation site within an LPP EUV source plasma chamber The line-emitting element may be in pure form or alloy form (e.g., an alloy that is a liquid at desired temperatures), or may be mixed or dispersed with another material such as a liquid. Delivering this target material and the laser beam simultaneously to a desired irradiation site within an LPP EUV source plasma chamber for plasma initiation presents certain timing and control problems, as it is necessary to hit the target properly in order to obtain sufficient plasma to maximize EUV light generation. In fact, the position of the laser beam focus relative to the droplets determines, in part, the power output of the EUV light source.

Thus, the laser beam must be focused on a focus position through which the target material will pass, and must be timed so as to intersect the target material when it passes through that point. In a three-dimensional space, drops of the target material travel along an x-axis and the laser beam travels along a z-axis (with a y-axis intersecting the x- and z-axes). The focus position of the laser beam is determined by two separate optical elements: a lens (the "final focus lens" or "FF lens") and a steering mirror (the "final focus steering mirror" or "FF steering mirror"). To keep the laser beam focused on the focus position, an FF mirror (FFY) control loop algorithm directs alignment of the steering mirror to position the laser beam along the y-axis and an FF lens (FFZ) control loop algorithm calibrates lens alignment to position the laser beam along the z-axis.

Within current LPP EUV systems, these feedback control loops are used to dynamically track and adjust axial positioning of the FF lens and the FF steering mirror in order to control lens alignment. A sensor (e.g., a return beam diagnostic (RBD) camera) can determine a relative focal position—that is, where the beam is focused relative to the droplet. Thus, in theory, one can implement a feedback control loop receiving input from a relative focal position sensor to maintain the laser beam focused on the target material (e.g., droplet). The problem with a RBD approach, however, is that it can yield a biased measurement that can indicate movement of the relative beam-to-droplet alignment when, in reality, the alignment is stationary. Thus, control algorithms based on input from relative focal position sensors are of limited utility. What is needed, therefore, is an improved way to accurately track and adjust the position of each optical element so as to be able to maintain focus of the laser beam on the droplet.

SUMMARY

In one embodiment is provided a method of positioning an optical element to optimize power output from an extreme ultraviolet (EUV) light source comprising: measuring with a sensor a metric of a proxy function having an extremum correlated with maximum EUV generation, the metric resulting from a focal setpoint of the EUV light source relative to a target droplet, the focal setpoint based on a current position of the optical element along an axis; removing by a computing device DC bias from the metric; extracting by the computing device a gradient of the bias-removed metric with respect to the position of the optical element; determining by the computing device an average gradient for the metric gradient; estimating by the computing device based on the average gradient a current position setpoint for the optical element along the axis; augmenting the estimated current position setpoint with a dither signal to obtain a target setpoint; and outputting by the computing device a control signal for adjusting an actuator to change the position of the optical element along the axis from the current position setpoint to the target setpoint.

In another embodiment is provided a method of positioning two optical elements to optimize power output from an extreme ultraviolet (EUV) light source comprising: measuring with a sensor a metric of a proxy function having an extremum correlated to maximum EUV generation, the metric resulting from a focal setpoint of the EUV light source relative to a target material, the focal setpoint based on a first current position of the first optical element along a first axis and a second current position of the second optical element along a second axis; removing by a computing device DC bias from the metric; extracting by the computing device a first gradient of the bias-removed metric with respect to the position of the first optical element and a second gradient of the metric with respect to the position of the second optical element; determining by the computing device a first gradient average for the metric first gradient and a second gradient average of the metric second gradient; estimating by the computing device a first current position setpoint for the first optical element along the first axis based on the first gradient average and a second current position setpoint for the second optical element along the second axis based on the second gradient average; augmenting the estimated first current position setpoint for the first optical element with a first dither signal to obtain a first target setpoint and the estimated second current position for the second optical element with a second dither signal to obtain a second target setpoint; and outputting by the computing device a first control signal for adjusting a first actuator to change the position of the first optical element along the first axis from the first current position setpoint to the first target setpoint and a second control signal for adjusting a second actuator to change the position of the second optical element along the second axis from the second current position setpoint to the second target setpoint.

A system for positioning an optical element to optimize power output from an extreme ultraviolet (EUV) light source comprising: one or more sensors configured to measure a metric of a proxy function having an extremum correlated to maximum EUV generation, the metric resulting from a focal setpoint of the EUV light source relative to a target material, the focal setpoint based on a position of an optical element along an axis; and a computing device configured to remove DC bias from the metric; extract a gradient of the bias-removed metric with respect to the position of the optical element; determine an average gradient for the metric; estimate a position setpoint for each optical element based on the average gradient; augment the position setpoint estimate with a dither signal to obtain a target setpoint; and output a control signal for adjusting an actuator to change the position of the optical element along the axis to the target setpoint.

A non-transitory computer readable medium having stored thereupon computing instructions comprising: a code segment to measure with a sensor a metric of a proxy function having an extremum correlated to maximum EUV generation, the metric resulting from a focal setpoint of the EUV light source relative to a target droplet, the focal setpoint based on a current position of the optical element along an axis; a code segment to remove by a computing device DC bias from the metric; a code segment to extract by the computing device a gradient of the bias-removed metric with respect to the position of the optical element; a code segment to determine by the computing device an average gradient for the metric gradient; a code segment to estimate by the computing device based on the average gradient a current position setpoint for the optical element along the axis; a code segment to augment the estimated current position setpoint with a dither signal to obtain a target setpoint; and a code segment to output by the computing device a control signal for adjusting an actuator to change the position of the optical element along the axis from the current position setpoint to the target setpoint.

A non-transitory computer readable medium having stored thereupon computing instructions comprising: a code segment to measure with a sensor a metric of a proxy function having an extremum correlated to maximum EUV generation, the metric resulting from a focal setpoint of the EUV light source relative to a target material, the focal setpoint based on a first current position of the first optical element along a first axis and a second current position of the second optical element along a second axis; a code segment to remove by a computing device DC bias from the metric; a code segment to extract by the computing device a first gradient for the bias-removed metric with respect to the position of the first optical element and a second gradient of the bias-removed metric with respect to the position of the second optical element; a code segment to determine by the computing device a first gradient average of the metric first gradient and a second gradient average of the metric second gradient; a code segment to estimate by the computing device a first current position setpoint for the first optical element along the first axis based on the first gradient average and a second current position setpoint for the second optical element along the second axis based on the second gradient average; a code segment to augment the estimated first current position setpoint for the first optical element with a first dither signal to obtain a first target setpoint and the estimated second current position for the second optical element with a second dither signal to obtain a second target setpoint; and a code segment to output by the computing device a first control signal for adjusting a first actuator to change the position of the first optical element along the first axis from the first current position setpoint to the first target setpoint and a second control signal for adjusting a second actuator to change the position of the second optical element along the second axis from the second current position setpoint to the second target setpoint.

DETAILED DESCRIPTION OF THE INVENTION

Figure 1:
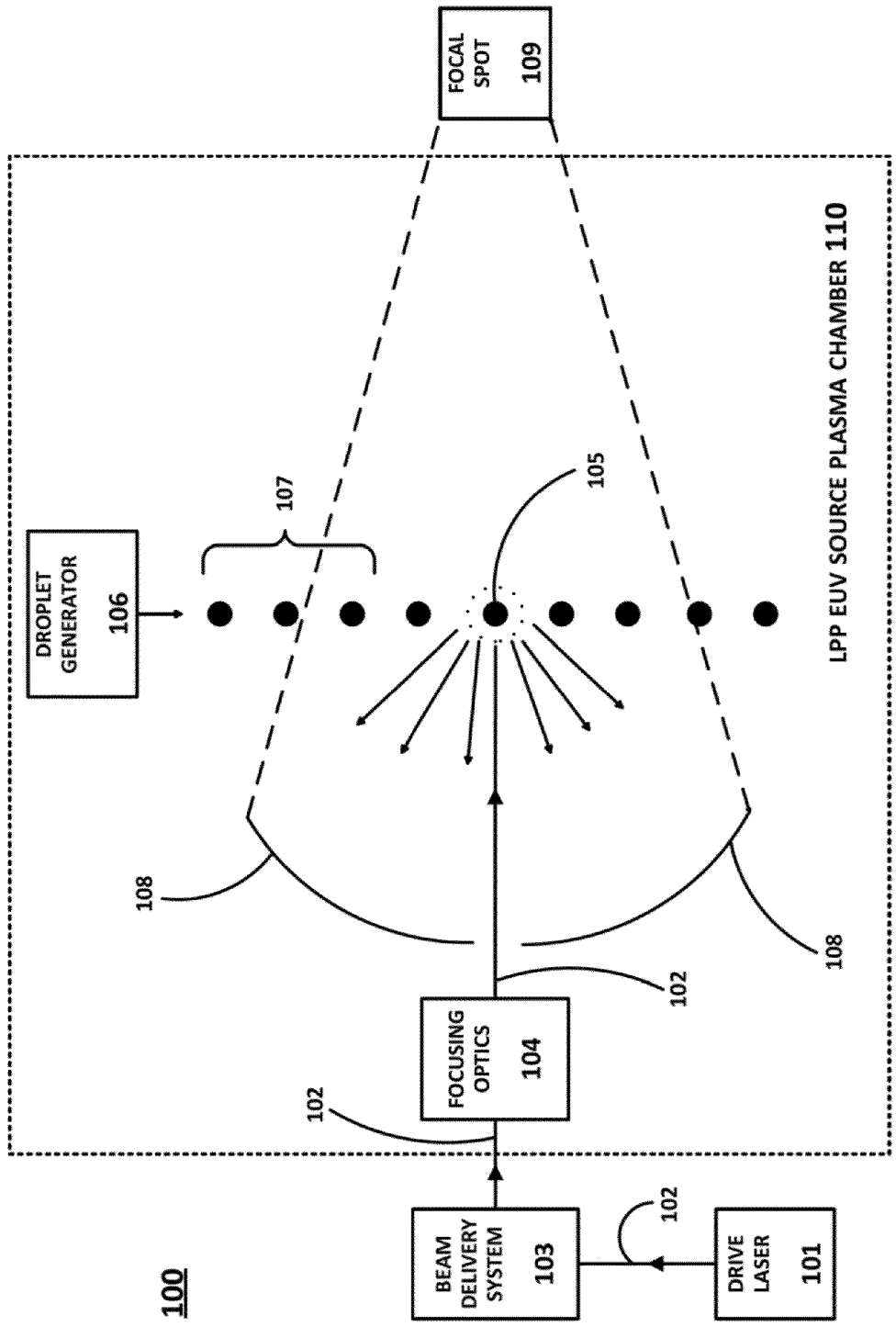
FIG. 1 is a schematic illustrating some of the components of a typical LPP EUV system 100.

FIG. 1 illustrates some of the components of a typical LPP EUV system 100. A drive laser 101, such as a $CO_2$ laser, produces a laser beam 102 that passes through a beam delivery system 103 and through focusing optics 104 (comprising a lens and a steering mirror). Focusing optics 104 have a primary focal spot 105 at an irradiation site within an LPP EUV source plasma chamber 110. A droplet generator 106 produces droplets 107 of an appropriate target material that, when hit by laser beam 102 at the irradiation site, generate a plasma which irradiates EUV light. An elliptical mirror ("collector") 108 focuses the EUV light from the plasma at a focal spot 109 (also known as an intermediate focus position) for delivering the generated EUV light to, e.g., a lithography scanner system. Focal spot 109 will typically be within a scanner (not shown) containing the boats of wafers that are to be exposed to the EUV light, with a portion of the boat containing wafers currently being irradiated being located at focal spot 109. In some embodiments, there may be multiple drive lasers 101, with beams that all converge on focusing optics 104. One type of LPP EUV light source may use a $CO_2$ laser and a zinc selenide (ZnSe) lens with an anti-reflective coating and a clear aperture of about 6 to 8 inches.

Figure 2:
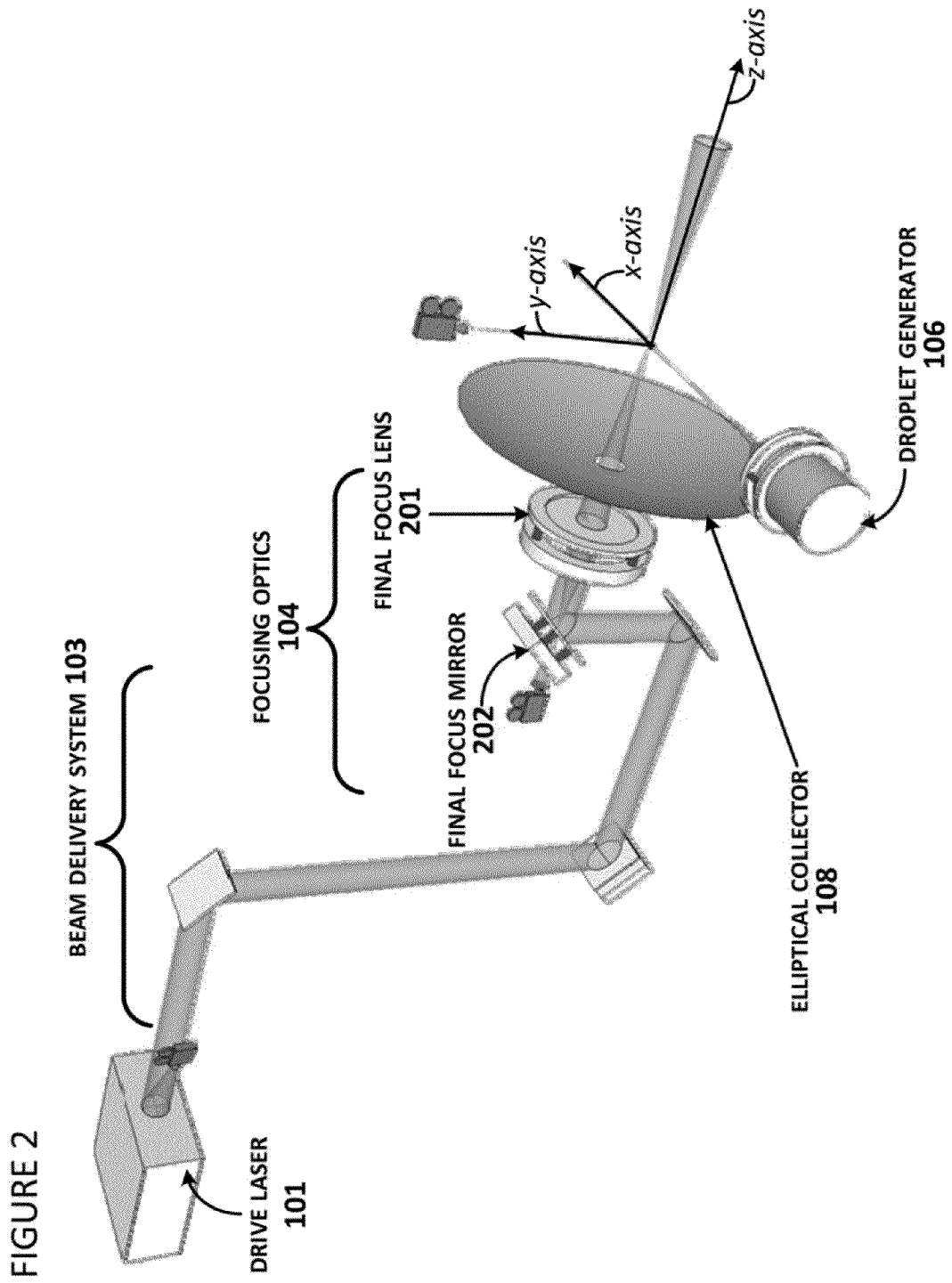
FIG. 2 is a diagram depicting EUV system components involved in optimization of EUV output according to one embodiment.

A magnified schematic of focusing optics 104 within the typical LPP EUV system is shown in FIG. 2. Focusing optics 104 comprises an FF lens 201, the setpoint of which ("FF lens setpoint") is correlated with positioning along the z-axis of primary focal spot 105, and an FF mirror 202, the setpoint of which ("FF steering mirror setpoint") is correlated with positioning along the y-axis of primary focal spot 105. The setpoint of droplet generator 106 determines positioning along the x-axis of primary focal spot 105. Thus, the (x, y, z) position at which the laser is focused (a "focal setpoint") comprises the FF lens setpoint, the FF steering mirror setpoint, and the droplet generator setpoint. Control of the focal setpoint along the x-axis is not further discussed herein, and is to be considered constant for the purposes of further discussion herein.

Figure 3:
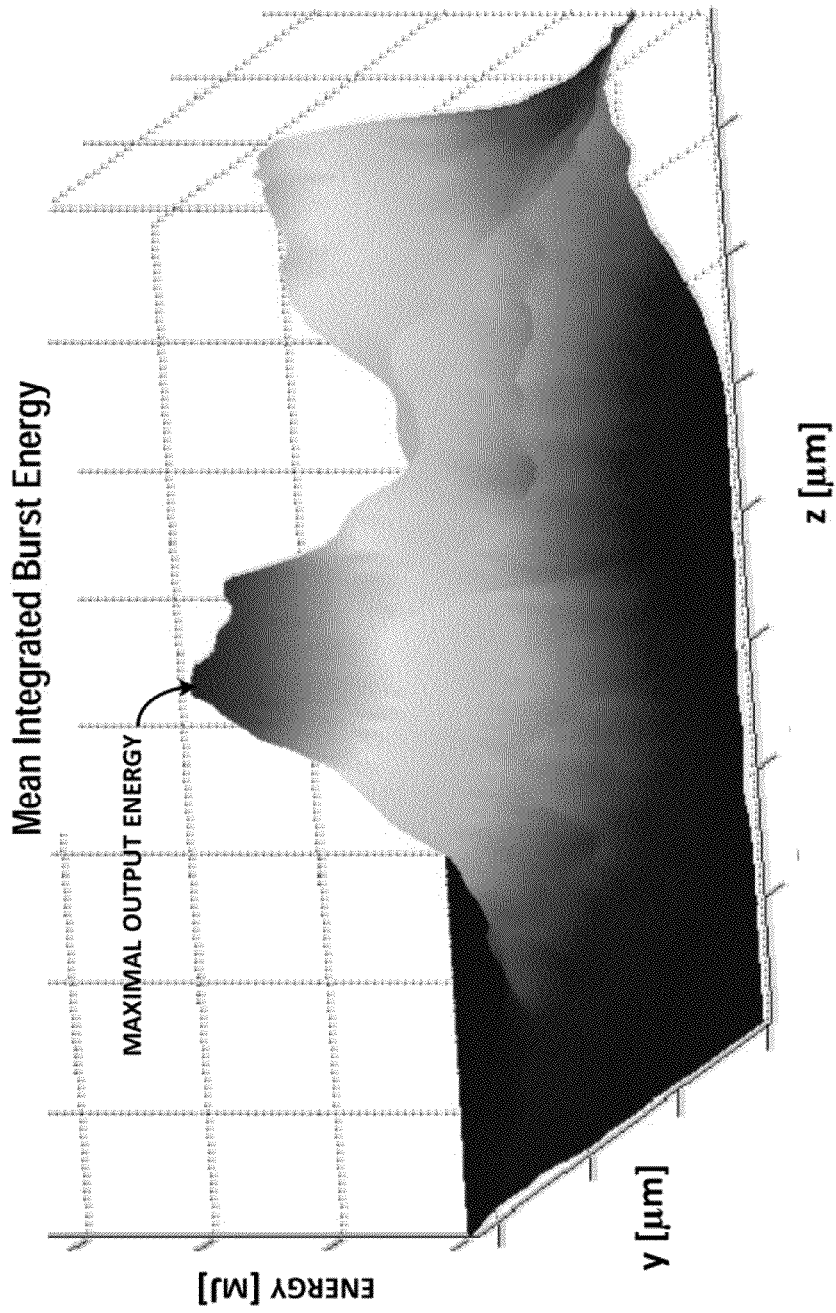
FIG. 3 shows a three-dimensional EUV energy map in which mean integrated burst energy is plotted as a function of (y-, z-) axial position.

Energy output from the LPP EUV system varies based on how well the position of laser beam 102 (determined by the focal setpoint) can be focused and can maintain focus on primary focal spot 105. A three-dimensional energy map that shows energy output (e.g., burst energy) as a function of positioning of primary focal spot 105 along the y-axis and z-axis can be generated by measuring EUV energy at each grid location in a yz-parameter space grid (i.e., by measuring EUV energy at every (y, z) position). An exemplar EUV energy map showing integrated burst energy plotted as a function of (y-, z-) axial position is presented in FIG. 3. As indicated by an arrow, an optimal focal setpoint can be identified at which maximal energy is achieved.

Maximizing LPP EUV output in real-time and/or maintaining a relative alignment of the laser beam and the droplet is difficult, however, because neither the energy map nor the optimal FF lens and FF mirror positions are known at light source startup. The LPP EUV system can determine a relative focal position of the laser beam to the droplet and this measurement can, in theory, be used in a feedback loop to control real-time focal setpoint positioning. In practice, however, sensors measuring relative focal position cannot reliably achieve focal setpoint and are, therefore, not suitable for real-time focal position control.

Figure 4:
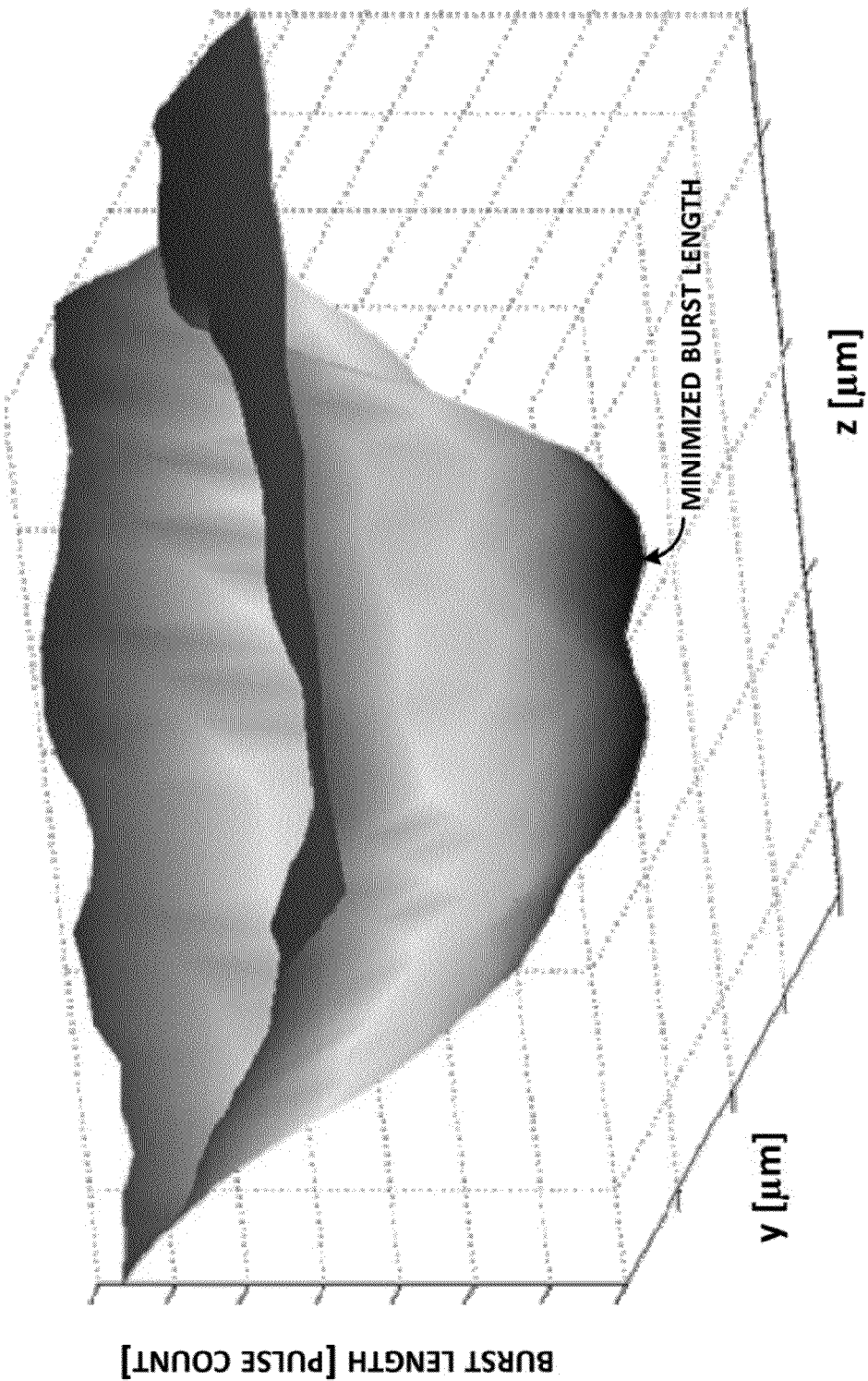
FIG. 4 shows a three-dimensional energy map of a proxy function in which burst length is plotted as a function of (y-, z-) axial position.
Figure 5:
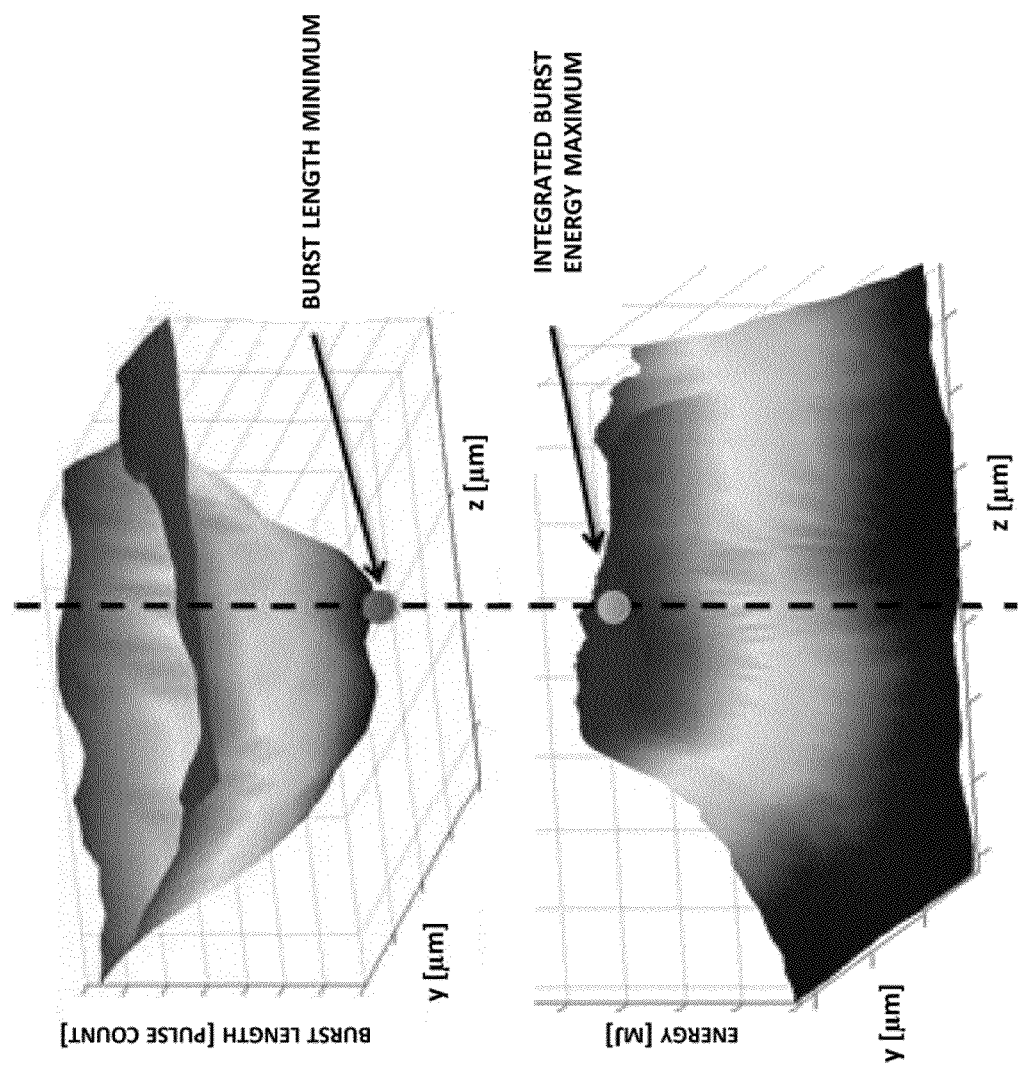
FIG. 5 shows a three-dimensional contour map of a proxy output function (burst length) over the yz-plane aligned with a three-dimensional contour map of burst energy over the yz-plane.

The system and method described herein optimize LPP EUV output by using a closed-loop gradient optimization process to track and fine-tune the focal setpoint and thereby maintain real-time alignment of the drive laser on droplet position. Because a closed-loop energy map is flat (and therefore provides little gradient information), an easily measured proxy function for output energy is used in place of actual energy output. The proxy function is an output function (e.g., pulse count per burst ("burst length"), pulse energy, or radio frequency (RF)) correlated to EUV output such that the proxy function has an extremum (maximum or minimum) correlated with maximum EUV output. A three-dimensional contour plot for an exemplar proxy function (burst length) is shown in FIG. 4. As indicated by an arrow, the optimal (y, z) setpoint yields an optimized (here, minimized) burst length. Because the proxy function of FIG. 4 is aligned with an EUV energy map, minimum burst length necessarily corresponds, as seen in FIG. 5, with maximum EUV output.

The control algorithm of present interest relies on dithering the FF lens and/or FF mirror to ensure that the lens and mirror remain in positions such that optimal EUV energy is achieved in real time. Feedback control based on dithering of an optical element has historically been a disfavored approach because of two issues. The first issue involves EUV power. $CO_2$ laser energy is a limiting factor in EUV light generation. Because a finite quantity of $CO_2$ is available within the LPP EUV system, introducing additional EUV perturbations through dithering of the FF lens (or FF mirror) incurs additional (undesirable) EUV generation quality errors that have to be accommodated by inducing a change to $CO_2$ energy. The second issue involves measurement stability. In addition to not being known at laser startup, the energy map drifts rapidly during laser firing. Thus, measuring and actuating fast enough to estimate where the energy map is moving is difficult. That tracking of droplet with lens and mirror positioning can be tracked rapidly enough using a dithering approach was not known before advent of the solution described herein.

The gradient method described herein allows an optical element controller to iteratively dither the position of the FF lens and/or FF mirror based on feedback acquired from the proxy function (e.g., pulse count per burst) until the proxy function—and thereby the output energy—is optimized. By applying perturbations to the lens and/or mirror position, an average gradient for the proxy function with respect to optimization parameters (e.g., FF lens position and/or FF mirror position) can be determined using an average energy measurement from several sensors spatially distributed around the plasma chamber (i.e., one metric of the proxy function) for each iteration of the gradient process. The lens and/or mirror position can then be adjusted to drive the average gradient of the proxy function towards a predefined offset (typically 0). Successive iterations of the closed-loop gradient process allow the average gradient to approach successively closer to the predefined offset. When the average gradient reaches the predefined offset, the proxy function, as well as the LPP EUV output, is optimized.

Thus, the method provides an alternative to currently used RBD camera feedback-based focus control. The optimization process can be used, moreover, in conjunction with a feedforward mechanism to compensate for known drift in setpoint location due to thermal effects on the FF lens and FF mirror.

Figure 6:
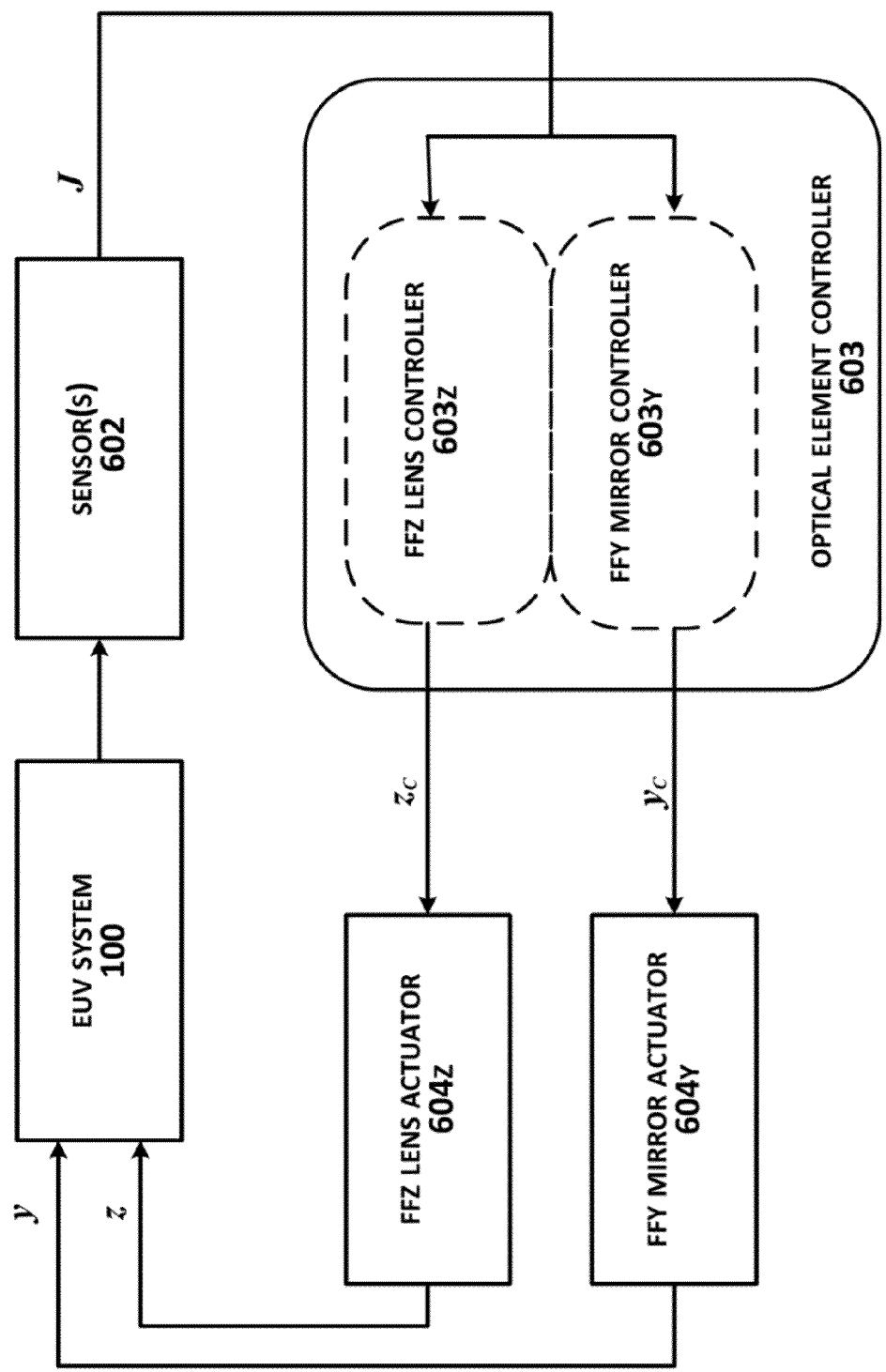
FIG. 6 is a block diagram providing an overview of a feedback control loop to optimize axial positioning of the optical element according to one embodiment.

A block diagram providing an overview of the feedback control loop used to optimize the position of the optical element(s) (e.g., the FF lens and/or FF mirror) according to one embodiment is presented in FIG. 6. LPP EUV system 100 generates EUV light within LPP EUV source plasma chamber 110 as discussed with respect to FIG. 1. One or more sensor 602 (inside or outside LPP EUV source chamber 110) senses one or more property (e.g., pulse count per burst ("burst length"), pulse energy, or radio frequency (RF)) of the generated EUV light. The sensed property (i.e., a "metric" of the output proxy function), 1, is then passed to one or more optical element controller 603 to be used in the optimization of the FF lens and/or FF mirror position(s).

Optical element controller 603 can be a FF lens controller 603z, and/or a FF mirror controller 603y. Optical element controller 603 determines a new axial position for the optical element (along the z-axis for the FF lens and/or along the y-axis for the FF mirror) with a gradient optimization process (discussed in greater detail herein). Optical element controller 603 then communicates a command to an optical element actuator such as a stepper motor (z, to FF lens actuator 604z and/or $y_c$ to FF mirror actuator 604y) to actuate movement of the FF lens along the z-axis to that new position (z) and/or movement of the FF mirror along the y-axis to that new position (y). EUV system 100 can then again lase, this time with a repositioned focal setpoint based on the new commanded position for the FF lens and/or FF mirror. Feedback controlled positioning of the FF lens and feedback controlled positioning of the FF mirror can be performed concurrently or independently.

The methods embodied herein use some assumptions. The first assumption is that an initial setpoint of the FF lens and/or FF mirror (e.g., at laser startup) is/are established within an optimal setpoint's region of attraction (RoA). The RoA depends on the shape of an optimization space (i.e., bounded area within which axial positioning can be optimized). If the initial setpoint is assigned outside the RoA, convergence to local (and incorrect) extrema can occur. The second assumption is that the setpoint of the FF lens and/or FF mirror can be maintained within the RoA (e.g., via feed-forward compensation). The third assumption is that drift in the optimal setpoint of the FF lens and/or FF mirror due to thermal effects can be counterbalanced according to an assumed drift trajectory. These assumptions are useful for two reasons. First, generation of 0 EUV energy is a fixed point (i.e., an extremum) of the energy map. Thus, unless some EUV is being generated, the dithering process discussed herein will not move the focal setpoint. Second, although local extrema exist within small regions on the energy map, all of those local extrema do not lead to desirable EUV generation properties. Thus, it is important to begin the dithering method in a position that can adjusted to the optimize position.

Figure 7:
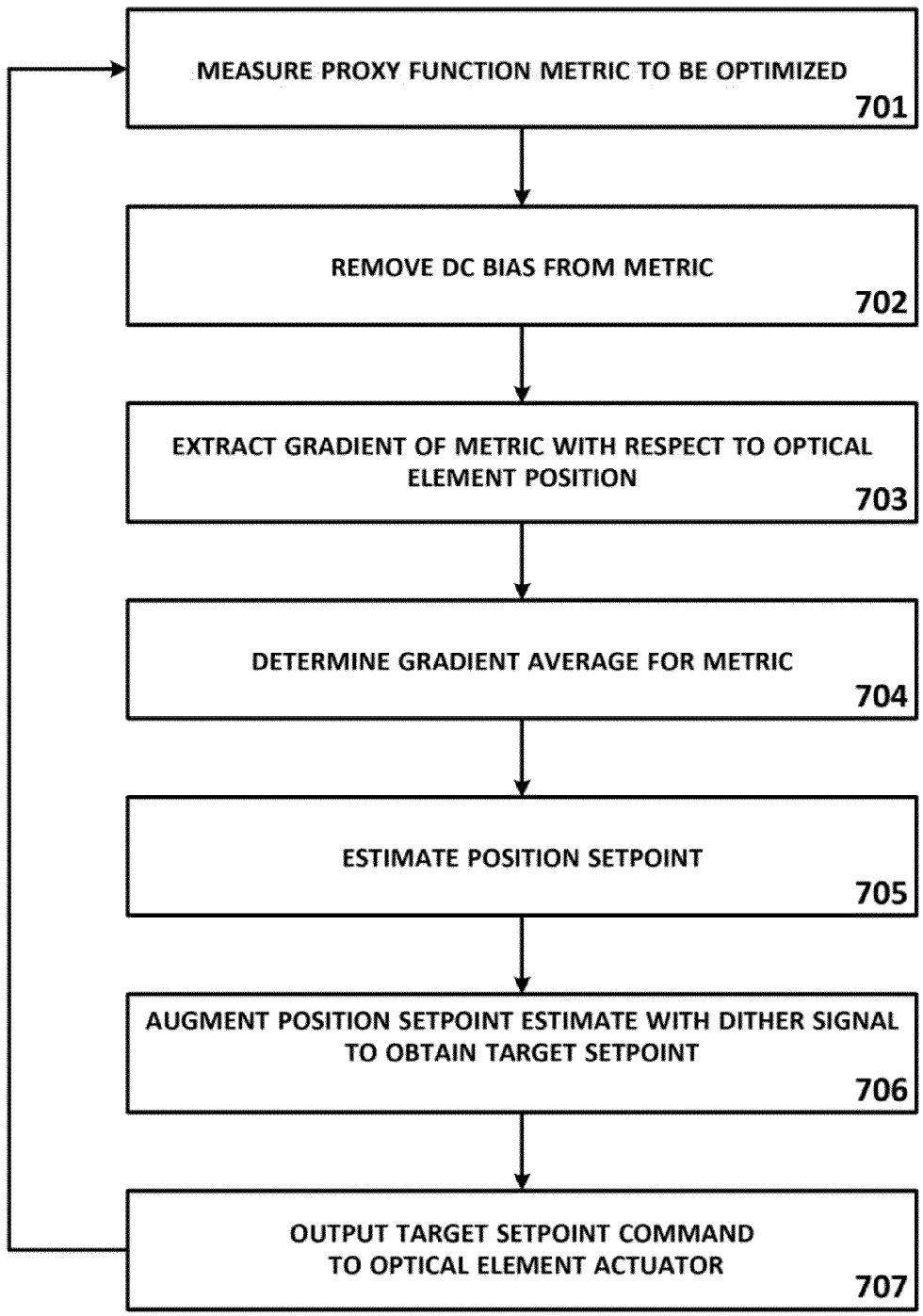
FIG. 7 is a flowchart detailing a method of optimizing axial positioning of the optical element along an axis according to one embodiment.
Figure 8:
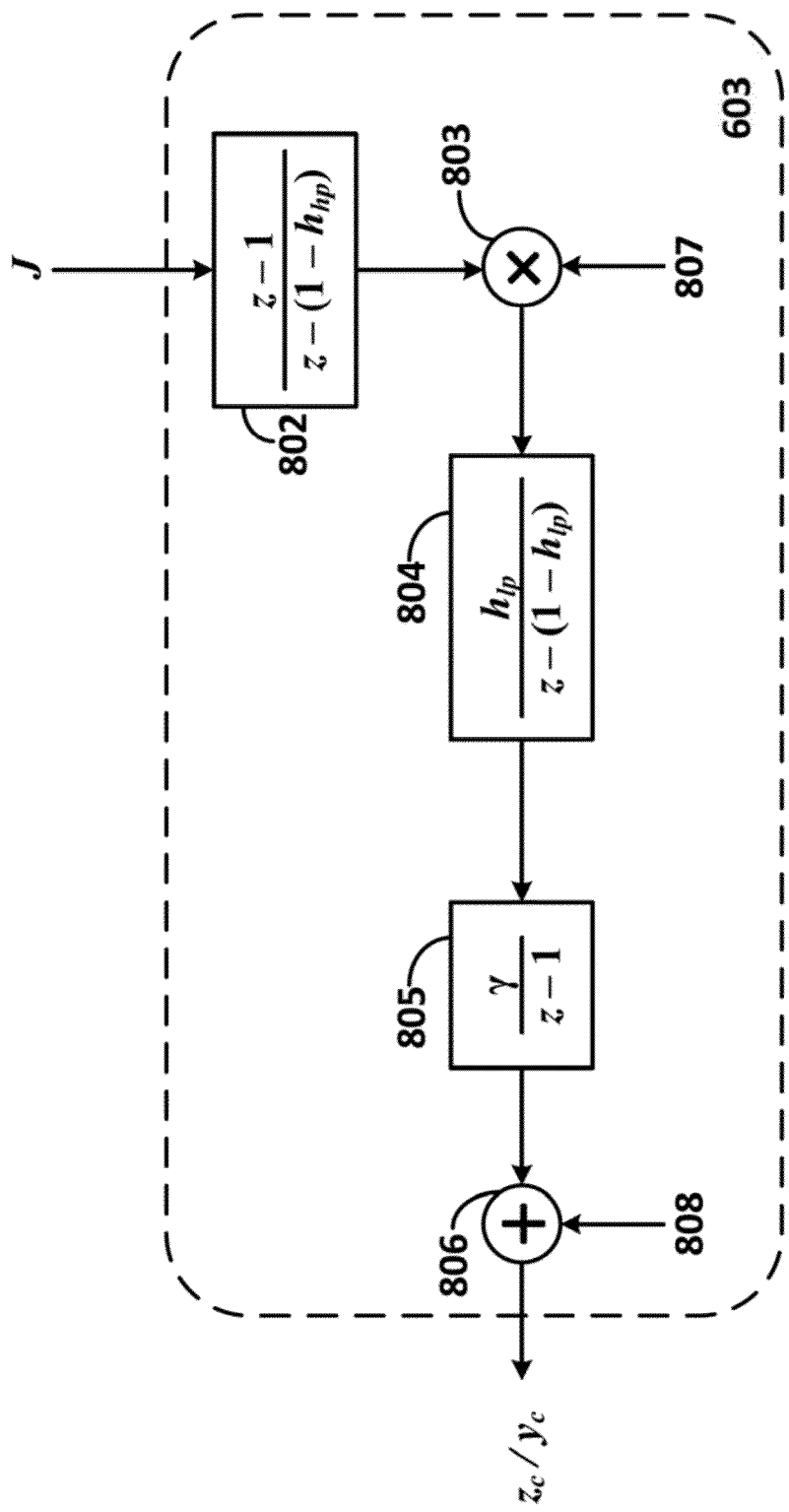
FIG. 8 is a block diagram detailing the control algorithm used to optimize axial positioning of the optical element according to one embodiment.

The gradient loop used to optimize the position of an optical element (FF lens or FF mirror) according to one embodiment is detailed in both the simplified flowchart of FIG. 7 and the mathematical block diagram of FIG. 8. The steps of FIG. 7 and the blocks of FIG. 8 are correspondingly numbered (e.g., step 702 of FIG. 7 corresponds to block 802 of FIG. 8) so as to permit discussion of FIG. 7 with continual reference to FIG. 8.

In step 701, a metric (symbolized as J in FIG. 8) of the proxy function for total EUV energy output is measured by sensors within the laser system and communicated to optical element controller 603. For example, the number of pulses within a burst can be sensed to obtain the metric "pulse count per burst" (or "burst length") for given FFY and FFZ setpoints (e.g., $y_1$ and $z_1$). The metric can be any EUV output metric that has an extremum (maximum or minimum) correlated to maximum EUV generation (e.g., pulse count per burst ("burst length"), radio-frequency, average pulse energy, burst length, and/or burst energy).

In step 702, optical element controller 603 removes DC bias (constant components) from the metric waveform to be optimized. The effect of removing the DC bias is to set the mean of the metric waveform to 0. As shown in block 802, the DC bias is removed by filtering the metric waveform with a high-pass (washout) filter such as that defined by the equation $$\frac{z-1}{z-(1-h_{hp})}$$

wherein z is a discrete z-transform variable, $h_{hp}=1-e^{-\omega_{hp}T_s}$, $\omega$ is the perturbation frequency, hp is the high-pass filter cutoff frequency, and Ts is the sampling time. The high-pass filter can be a known standard filter structure (e.g., a first order Butterworth filter) or, in other embodiments, a more general highpass filter.

In step 703, optical element controller 603 extracts an estimated gradient with respect to the optimization parameter (e.g., the change in the metric waveform as a function of the FF lens position or the FF mirror position) from the high-pass filtered metric waveform of step 702/block 802. As shown in block 803, the estimated gradient is extracted by demodulating the output of the high-pass filter, as for example, by multiplying the high-pass filter output by a demodulator signal 807. Demodulator signal 807 can be a sinusoid such as $$\sin(\omega t)$$

wherein $\omega$ is the perturbation frequency and t is a discrete time index. Demodulation signal 807 can be sinusoidal or otherwise (e.g., white noise or band-limited white noise created by using a standard random number generator).

In step 704, optical element controller 603 determines the average gradient by filtering the estimated gradient obtained in step 703/block 803 with a low-pass filter such as that defined in block 804 by the equation $$\frac{h_{lp}}{z-(1-h_{lp})}$$

wherein z is a discrete z-transform variable, $h_{lp}=1-e^{-\omega_{lp}T_s}$, $\omega$ is the perturbation frequency, lp is the low-pass filter cutoff frequency, and $T_s$ is the sampling time. The low-pass filter attenuates excessive oscillations (e.g., high frequency components) within the estimated gradient, and thereby reduces high-frequency noise not correlated with the optical element.

In step 705, optical element controller 603 further attenuates high-frequency terms within the low-pass filtered gradient average obtained from step 704/block 804 and generates an estimated position setpoint for the optical element through the use of a discrete integrator (or "accumulator") that can be (as shown in block 805), but need not be a sinusoid such as $$\frac{\gamma}{z-1}$$

wherein z is a discrete z-transform variable and $\gamma$ is a lowpass-filter cutoff for the integrator. In essence, the integrator acts to drive its input (the average gradient) to a predefined offset (typically 0). The integrator outputs the estimated position setpoint of the optical element. If the average gradient of step 704/block 804 is not equal to 0, the estimated position setpoint of the optical element output from the integrator changes from the estimated position setpoint of the previous iteration through the gradient loop. As the process depicted in FIGS. 7 and 8 iterates, the average gradient of step 704/block 804 approaches 0 and the integrator outputs successively smaller magnitude step changes from an immediately preceding position setpoint for the optical element. When the average gradient of step 704/block 804 is equal to 0, the optical element is already optimized, so the integrator turns off (i.e., does not output the estimated position setpoint).

The estimated position setpoint is essentially the magnitude of the average gradient plus the current position offset x. As an example, if the average gradient is 1, the integrator outputs an estimated position setpoint that would move the optical element to a new position that is +1 unit from the previous position offset x.

Because the integrator is a linear block, if the gradient estimate of step 704/block 804 is positive, the estimated position setpoint for the optical element will cause the optical element to move in the same direction as during the previous iteration of the gradient loop, whereas if the gradient estimate is negative, the estimated position setpoint for the optical element will cause the optical element to move in a different direction from the previous iteration of the gradient loop.

Because the integrator of step 705/block 805 has memory and tracks where the optical element is, the estimated position setpoint to be output from step 705/block 805 can be an absolute position setpoint (e.g., linear coordinate) or an output adjustment (e.g., move the setpoint+0.2 μm).

In step 706, optical element controller 603 augments the estimated setpoint position (generated in step 705/block 805) with a dither signal. The effect augmenting the estimated setpoint position with the dither signal is to perturb the previous setpoint position (estimated in step 705/block 805) and thereby obtain a (new) target setpoint for the optical element. The modulation signal 808 used to effect this perturbation can be, but need not be a sinusoidal function, as, for example, $$a \sin(\omega t)$$

wherein a is the perturbation magnitude (i.e., amplitude), ω is the perturbation frequency, and t is a discrete time index. The target setpoint converges to a neighborhood of an ideal setpoint with the neighborhood size depending inversely on the perturbation frequency and proportionally to the perturbation magnitude.

In step 707, optical element controller 603 outputs a target setpoint command to the optical element actuator (e.g., the stepper motor for the FF lens or FF mirror). The optical element actuator, in turn, translates the optical element along its axis to the target setpoint for that optical element (not shown).

When the source generates EUV with the focal point based on the target setpoint, the feedback control loop returns to step 701 and reiterates the gradient method for another instance of the metric (i.e., the metric resulting from the adjusting the optical element to the target setpoint).

In general, successive iterations through the gradient loop provide local convergence results (i.e., optimize energy output by fine-tuning the positioning of the optical element within a region of interest), but for energy output maps that are sufficiently concave and possess a single/maximum (or convex and possess and single minimum), semi-global convergence results (i.e., optimize energy output by gross-tuning the positioning of the optical element within a wider region) can be obtained.

Multivariate Embodiments

Two-dimensional optimization (i.e., along both the z- and y-axis) can also be achieved using the feedback control loop. Two assumptions are made for two-dimensional optimization, namely that any phase introduced by actuator dynamics is negligible; hence $\phi_y = \phi_z = 0$; and If sinusoids are used as dither signals, the sinusoid frequencies $\omega_y \neq \omega_z$.

Due to the orthogonality of sine and cosine waves, the second assumption can be relaxed, and any two gradient loops may utilize the same perturbation frequency ω if one loop employs sine waves and the other cosine waves. However, any uncompensated phase effects will diminish performance, so using the same perturbation frequency is not preferred.

When implementing the multivariate embodiments, coupling exists between the FFZ and FFY feedback control loops once the sensor measurement is made. It is assumed that the errors incurred by ignoring the coupling are small enough to be ignored in the process described herein. Thus, gradient loops can be run at different update rates and can use signals (sinusoidal or otherwise) with frequencies that are limited only by their respective actuators.

Implementation Guidelines

The parameters of the gradient loop balance several tradeoffs including, in particular, the rate of convergence versus the size of the convergence neighborhood.

In yet another embodiment, the target setpoint output in block 707 becomes (after being filtered by a band-pass filter) demodulation signal 807 for the next iteration through optical element control loop 603. The band-pass filter is selected to attenuate the noise on both the performance metric measurements and the optical element position measurements. Convergence analysis can be performed when using high-pass filters (as discussed herein) and the same average error system can be found. The benefit of this embodiment is that uncompensated phase effects are not a concern. The price to pay for this benefit is that additional noise is injected into optical element controller 603 and additional filters may need to be added to attenuate this added noise. The cutoff frequencies of the band-pass filters in this embodiment should be chosen to be equal to the frequency of the modulation signal, that is, equal to w. Further explanation can be found in S. Van der Meulen, et al., "Combining extremum seeking control and tracking control for high performance CVT operation", in *Proc. IEEE Conf. on Decision and Control*, Atlanta, Ga., December 1010, pp. 3668-3673, hereby incorporated herein by reference in its entirety.

In a simulated test case of the present approach, FFZ lens controller 603z was used to position the FF lens and FFY mirror controller 603y to position the FF mirror so that the mean pulse count per burst was minimized.

Figure 9:
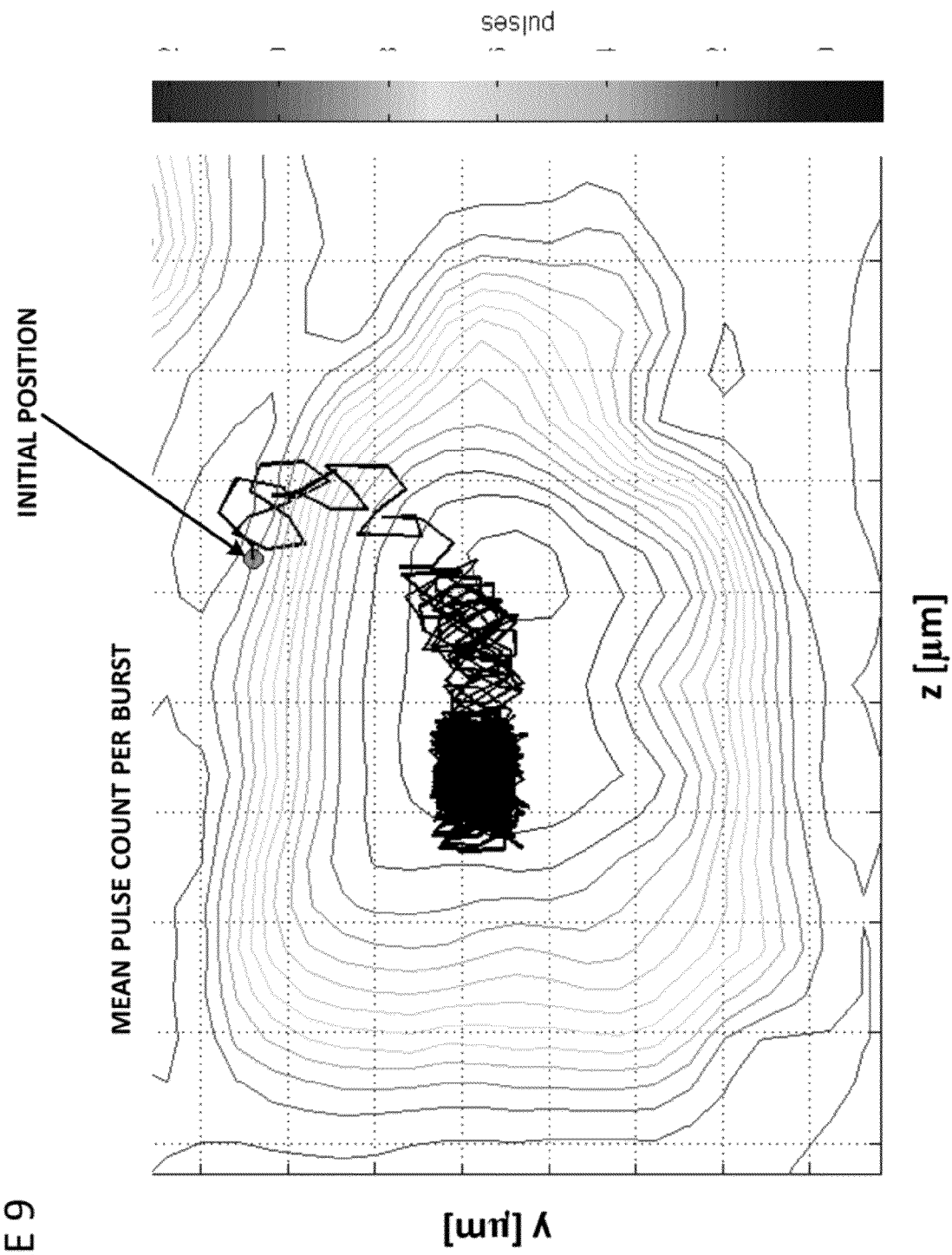
FIG. 9 shows exemplary data in a contour plot of mean pulse count as a function of (y-, z-) axial position with a trajectory of adjustments to FF lens and FF mirror positions superimposed.

At each iteration of the gradient loop, the mean pulse count per burst was computed over the bursts since the previous iteration. A contour plot of mean pulse count per burst as a function of the (y, z)-position is shown in FIG. 9. Initial setpoints of the FFZ lens and FFY steering mirror along their respective axes are denoted by the dot. The trajectory of the FF lens and the FF steering mirror target setpoints over successive iterations of the gradient loop are superimposed on the contour plot. As can be seen in the figure, the target setpoints along the y- and z-axes were adjusted through successive iterations of the gradient loop to bring the axial setpoints successively closer to the optimized (y, z)-position at which point the mean pulse count per burst is minimized. Because minimum pulse count per burst correlates with maximum energy output, the optimized positioning of the FFZ along the z-axis and the FFY steering mirror along the y-axis indicates combined target setpoints yielding the focal setpoint that generates maximal EUV energy.

To avoid a prolonged discussion of thermal effects on the system (which cause the optimization map to drift) and the feed-forward compensation for these effects, this simulation was done with a fixed optimization map. However, similar results are obtained when the simulation includes drift of the optimization map. Quantization effects for the lens stepper motor were included, as were saturation limits for both the FFY and FFZ feedback control loops. Currently, the simulation does not support independent update rate for the FFY and FFZ feedback control loops; otherwise, the update rate and perturbation frequency for the FFY feedback control loop could be increased since the actuation is not as limiting as that in the FFZ feedback control loop.

One of skill in the art will understand that the system and method described herein can be implemented with gradient parameters in continuous rather than discrete time with appropriate analogue circuitry.

The disclosed method and apparatus has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than those described above. For example, different algorithms and/or logic circuits, perhaps more complex than those described herein, may be used, as well as possibly different types of drive lasers and/or focus lenses.

Further, it should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc., or a computer network wherein the program instructions are sent over optical or electronic communication links. It should be noted that the order of the steps of the methods described herein may be altered and still be within the scope of the disclosure.

It is to be understood that the examples given are for illustrative purposes only and may be extended to other implementations and embodiments with different conventions and techniques. While a number of embodiments are described, there is no intent to limit the disclosure to the embodiment(s) disclosed herein. On the contrary, the intent is to cover all alternatives, modifications, and equivalents apparent to those familiar with the art.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method of positioning an optical element to optimize power output from an extreme ultraviolet (EUV) light source comprising:
   (a) measuring with a sensor a metric of a proxy function having an extremum correlated to maximum EUV generation, the metric resulting from a focal setpoint of the EUV light source relative to a target material, the focal setpoint based on a current position of the optical element along an axis;
   (b) removing by a computing device DC bias from the metric;
   (c) extracting by the computing device a gradient of the bias-removed metric with respect to the position of the optical element;
   (d) determining by the computing device an average gradient for the metric gradient;
   (e) estimating by the computing device based on the average gradient a current position setpoint for the optical element along the axis;
   (f) augmenting the estimated current position setpoint with a dither signal to obtain a target setpoint; and
   (g) outputting by the computing device a control signal for adjusting an actuator to change the position of the optical element along the axis from the current position setpoint to the target setpoint.

2. The method of claim 1 wherein the metric is a pulse count per burst, burst length, average pulse energy, or radio frequency.

3. The method of claim 1 wherein steps (a), (b), (c), (d), (e), (f), and (g) are repeated until the metric is optimized.

4. The method of claim 3 wherein the proxy function is optimized when the extremum correlated to maximum EUV generation is achieved.

5. The method of claim 3 wherein the optimized metric is maximized.

6. The method of claim 3 wherein the optimized metric is minimized.

7. The method of claim 1 wherein the optical element is a final focus lens and the axis is a z-axis.

8. The method of claim 1 wherein the optical element is a final focus steering mirror and the axis is a y-axis.

9. A method of positioning two optical elements to optimize power output from an extreme ultraviolet (EUV) light source comprising:
   (a) measuring with a sensor a metric of a proxy function having an extremum correlated to maximum EUV generation, the metric resulting from a focal setpoint of the EUV light source relative to a target material, the focal setpoint based on a first current position of the first optical element along a first axis and a second current position of the second optical element along a second axis;
   (b) removing by a computing device DC bias from the metric;
   (c) extracting by the computing device a first gradient of the bias-removed metric with respect to the position of the first optical element and a second gradient of the metric with respect to the position of the second optical element;
   (d) determining by the computing device a first gradient average for the metric first gradient and a second gradient average of the metric second gradient;
   (e) estimating by the computing device a first current position setpoint for the first optical element along the first axis based on the first gradient average and a second current position setpoint for the second optical element along the second axis based on the second gradient average;
   (f) augmenting the estimated first current position setpoint for the first optical element with a first dither signal to obtain a first target setpoint and the estimated second current position for the second optical element with a second dither signal to obtain a second target setpoint; and
   (g) outputting by the computing device a first control signal for adjusting a first actuator to change the position of the first optical element along the first axis from the first current position setpoint to the first target setpoint and a second control signal for adjusting a second actuator to change the position of the second optical element along the second axis from the second current position setpoint to the second target setpoint.

10. The method of claim 9 wherein the first optical element is a final focus lens and the first axis is a z-axis.

11. The method of claim 9 wherein the second optical element is a final focus steering mirror and the second axis is a y-axis.

12. The method of claim 9 wherein the first optical element is a final focus lens and the second optical element is a final focus steering mirror.

13. The method of claim 9 wherein the metric is a pulse count per burst, burst length, average pulse energy, or radio frequency.

14. The method of claim 9 wherein steps (a), (b), (c), (d), (e), (f), and (g) are repeated until the metric is optimized.

15. The method of claim 14 wherein the proxy function is optimized when the extremum correlated to maximum EUV generation is achieved.

16. The method of claim 14 wherein the optimized metric is maximized.

17. The method of claim 14 wherein the optimized metric is minimized.

18. A system for positioning an optical element to optimize power output from an extreme ultraviolet (EUV) light source comprising:
one or more sensors configured to measure a metric of a proxy function having an extremum correlated to maximum EUV generation, the metric resulting from a focal setpoint of the EUV light source relative to a target material, the focal setpoint based on a position of the optical element along an axis; and
a computing device configured to
remove DC bias from the metric;
extract a gradient of the bias-removed metric with respect to the position of the optical element;
determine an average gradient for the metric;
estimate a position setpoint for each optical element based on the average gradient;
augment the position setpoint estimate with a dither signal to obtain a target setpoint; and
output a control signal for adjusting an actuator to change the position of the optical element along the axis to the target setpoint.

19. A non-transitory computer readable medium having stored thereupon computing instructions comprising:
a code segment to measure with a sensor a metric of a proxy function having an extremum correlated to maximum EUV generation, the metric resulting from a focal setpoint of the EUV light source relative to a target material, the focal setpoint based on a current position of an optical element along an axis;
a code segment to remove by a computing device DC bias from the metric;
a code segment to extract by the computing device a gradient of the bias-removed metric with respect to the position of the optical element;
a code segment to determine by the computing device an average gradient for the metric gradient;
a code segment to estimate by the computing device based on the average gradient a current position setpoint for the optical element along the axis;
a code segment to augment the estimated current position setpoint with a dither signal to obtain a target setpoint; and
a code segment to output by the computing device a control signal for adjusting an actuator to change the position of the optical element along the axis from the current position setpoint to the target setpoint.

20. A non-transitory computer readable medium having stored thereupon computing instructions comprising:
a code segment to measure with a sensor a metric of a proxy function having an extremum correlated to maximum EUV generation, the metric resulting from a focal setpoint of the EUV light source relative to a target material, the focal setpoint based on a first current position of a first optical element along a first axis and a second current position of a second optical element along a second axis;
a code segment to remove by a computing device DC bias from the metric;
a code segment to extract by the computing device a first gradient for the bias-removed metric with respect to the position of the first optical element and a second gradient of the bias-removed metric with respect to the position of the second optical element;
a code segment to determine by the computing device a first gradient average of the metric first gradient and a second gradient average of the metric second gradient;
a code segment to estimate by the computing device a first current position setpoint for the first optical element along the first axis based on the first gradient average and a second current position setpoint for the second optical element along the second axis based on the second gradient average;
a code segment to augment the estimated first current position setpoint for the first optical element with a first dither signal to obtain a first target setpoint and the estimated second current position for the second optical element with a second dither signal to obtain a second target setpoint; and
a code segment to output by the computing device a first control signal for adjusting a first actuator to change the position of the first optical element along the first axis from the first current position setpoint to the first target setpoint and a second control signal for adjusting a second actuator to change the position of the second optical element along the second axis from the second current position setpoint to the second target setpoint.

\* \* \* \* \*